US012529141B2

(12) United States Patent
Banerjee et al.

(10) Patent No.: US 12,529,141 B2
(45) Date of Patent: Jan. 20, 2026

(54) METHODS OF FORMING TRANSISTOR INTERCONNECTS ON TOP OF A SEMICONDUCTOR DEVICE SUBSTRATE

(71) Applicant: Destination 2D Inc., Milpitas, CA (US)

(72) Inventors: Kaustav Banerjee, Goleta, CA (US); Ravi Iyengar, Milpitas, CA (US); Brian Cronquist, Klamath Falls, OR (US)

(73) Assignee: Destination 2D Inc., Milpitas, CA (US)

( * ) Notice: Subject to any disclaimer, the term of this patent is extended or adjusted under 35 U.S.C. 154(b) by 0 days.

(21) Appl. No.: 19/059,188

(22) Filed: Feb. 20, 2025

(65) Prior Publication Data

US 2025/0361617 A1 Nov. 27, 2025

Related U.S. Application Data

(63) Continuation of application No. 18/942,000, filed on Nov. 8, 2024, which is a continuation of application No. 18/674,085, filed on May 24, 2024.

(51) Int. Cl.
*H01L 21/383* (2006.01)
*C23C 16/26* (2006.01)
*C23C 16/46* (2006.01)

(52) U.S. Cl.
CPC .............. *C23C 16/46* (2013.01); *C23C 16/26* (2013.01)

(58) Field of Classification Search
CPC .............................. C23C 16/46; C23C 16/26
See application file for complete search history.

(56) References Cited

U.S. PATENT DOCUMENTS 5,480,678 A * 1/1996 Rudolph ............. C23C 16/4411
118/724
11,976,369 B2 5/2024 Banerjee et al.
(Continued)

FOREIGN PATENT DOCUMENTS

WO 2024158578 A1 8/2024

OTHER PUBLICATIONS

Jiang et al., "CMOS-Compatible Doped-Multilayer-Graphene Interconnects for Next-Generation VLSI," 2018 IEEE International Electron Devices Meeting (IEDM), San Francisco, CA, USA, 2018, pp. 34.5.1-34.5.4, DOI: 10.1109/IEDM.2018.8614535.
(Continued)

*Primary Examiner* — Joseph A Miller, Jr.
(74) *Attorney, Agent, or Firm* — Greer, Burns & Crain, Ltd.; Steven P. Fallon

(57) ABSTRACT

A method of forming transistor interconnects on top of a semiconductor device substrate, the method including: providing a semiconductor device substrate with CMOS transistors and an inter-layer dielectric atop the CMOS transistors; depositing a metal (Ni, Co, Ru, or Mo) catalyst layer atop the inter-layer dielectric; depositing a diffusion material including carbon atop the metal catalyst layer; then loading the substrate into a process chamber onto a heatable bottom platen; a heatable top platen applies a mechanical pressure to the substrate; and then forming graphene disposed at an interface of the inter-layer dielectric and the metal catalyst layer, and where the process chamber is a part of a modified or unchanged commercial bonding tool, hot-press tool, or pressure and temperature-controlled reactor.

17 Claims, 11 Drawing Sheets

(56) References Cited

U.S. PATENT DOCUMENTS

| | | | |
|---|---|---|---|
| 12,170,248 | B2 | 12/2024 | Schuegraf et al. |
| 2007/0296035 | A1 | 12/2007 | George et al. |
| 2013/0074773 | A1* | 3/2013 | Liu .................... C23C 16/46 118/725 |
| 2013/0082235 | A1 | 4/2013 | Gu et al. |
| 2013/0149461 | A1* | 6/2013 | Dordi .................. C23C 16/56 427/577 |
| 2013/0313522 | A1 | 11/2013 | Nourbakhsh et al. |
| 2020/0090986 | A1* | 3/2020 | Lin ..................... H01L 21/0228 |
| 2020/0325574 | A1 | 10/2020 | Tseng et al. |
| 2023/0008834 | A1 | 1/2023 | Banerjee et al. |
| 2023/0105855 | A1 | 4/2023 | Banerjee |
| 2023/0313358 | A1 | 10/2023 | Banerjee et al. |
| 2024/0258118 | A1 | 8/2024 | Banerjee et al. |
| 2024/0295018 | A1 | 9/2024 | Banerjee et al. |

OTHER PUBLICATIONS

Jiang et al., "Intercalation Doped Multilayer-Graphene-Nanoribbons for Next-Generation Interconnects", Nano Letters, 2017, vol. 17, Issue 3, pp. 1482-1488, DOI: 10.1021/acs.nanolett.6b04516.

United States Patent and Trademark Office, Non Final Office Action mailed on Jul. 9, 2024, from related U.S. Appl. No. 18/674,085, 6 pages.

United States Patent and Trademark Office, Notice of Allowance mailed on Jan. 22, 2025, from related U.S. Appl. No. 18/942,000, 7 pages.

United States Patent and Trademark Office, Notice of Non-Compliant Amendment dated Oct. 21, 2024, from related U.S. Appl. No. 18/674,085, 3 pages.

Agashiwala; IEEE Trans on electron devices—V68 No. 4 Apr. 2021—Demonstration_of_CMOS-Compatible_Multi-Level_Graphene (Year: 2021).

Advanced Materials—2016—V28 Wang—Direct CVD Graphene Growth on Semiconductors—p. 4956-4975 (Year: 2016).

Banerjee; Proceedings of IEEE V98 No. 12 Dec. 2010 p. 2032-2046 Graphene_for_CMOS (Year: 2010).

Banerjee, et al., U.S. Appl. No. 18/674,085 titled Low-Temperature/Beol-Compatible Highly Scalable Graphene Synthesis Tools Including Retasked Tools, filed Jul. 9, 2024, 40 pages.

Banerjee, et al., U.S. Appl. No. 63/218,498 titled Wafer-Scale CMOS-Compatible Graphene Synthesis Tool, filed Jul. 6, 2021, 22 pages.

Banerjee, et al., U.S. Appl. No. 63/441,766 titled Large-Area/Wafer-Scale CMOS-Compatible 20-Material Doping Tools, Processes, and Methods, Including Doping of Synthesized Graphene, filed Jan. 27, 2023, 31 pages.

Notice of Abandonment for U.S. Appl. No. 18/674,085, mailed Mar. 28, 2025, 2 pages.

Non-Final Office Action dated for U.S. Appl. No. 18/674,085, mailed Jul. 9, 2024, 7 pages.

Non-Final Office Action for U.S. Appl. No. 18/942,000, mailed Mar. 14, 2025, 8 pages.

Final Office Action for U.S. Appl. No. 18/942,000, mailed Apr. 15, 2025, 7 pages.

PCT International Search Report and Written Opinion from related PCT Application No. PCT/US2025/024164, mailed Jul. 29, 2025, 11 pages.

* cited by examiner

METHODS OF FORMING TRANSISTOR INTERCONNECTS ON TOP OF A SEMICONDUCTOR DEVICE SUBSTRATE

CROSS-REFERENCE OF RELATED APPLICATIONS

This application is a continuation of U.S. patent application Ser. No. 18/942,000, filed on 08 Nov. 2024, titled METHODS OF FORMING TRANSISTOR INTERCONNECTS ON TOP OF A SEMICONDUCTOR DEVICE SUBSTRATE, which is a continuation of U.S. patent application Ser. No. 18/674,085, filed on 24 May 2024, titled LOW-TEMPERATURE/BEOL-COMPATIBLE HIGHLY SCALABLE GRAPHENE SYNTHESIS TOOLS INCLUDING RETASKED TOOLS, and the entire contents of the foregoing are incorporated herein by reference.

The following are related applications:

U.S. patent application Ser. No. 18/607,380, filed on 15 Mar. 2024, titled GRAPHENE BEOL INTEGRATION INTERCONNECTION STRUCTURES, published as U.S. Pat. Pub. No. 2024/0339407 and now U.S. Pat. No. 12,170,248;

U.S. patent application Ser. No. 18/527,043, filed on 1 Dec. 2023, LARGE-AREA WAFER-SCALE CMOS-COMPATIBLE 2D-MATERIAL INTERCALATION DOPING TOOLS, PROCESSES, AND METHODS, INCLUDING DOPING OF SYNTHESIZED GRAPHENE, published as U.S. Pat. Pub. No. 2024/0258118;

U.S. patent application Ser. No. 17/863,232, filed on 12 Jul. 2022, and titled LOW-TEMPERATURE/BEOL-COMPATIBLE HIGHLY SCALABLE GRAPHENE SYNTHESIS TOOL, published as U.S. Pat. Pub. No. 2023/0008834 and now U.S. Pat. No. 12,281,388;

U.S. patent application Ser. No. 17/857,954, filed on 5 Jul. 2022, and titled LOW-TEMPERATURE/BEOL-COMPATIBLE HIGHLY SCALABLE GRAPHENE SYNTHESIS TOOL, published as U.S. Pat. Pub. No. 2023/0105855 and now U.S. Pat. No. 11,976,369;

U.S. Provisional Patent Application No. 63/218,498, filed on 6 Jul. 2021, and titled WAFER-SCALE CMOS-COMPATIBLE GRAPHENE SYNTHESIS TOOL; and U.S. Provisional Patent Application No. 63/441,766, filed on 27 Jan. 2023, titled LARGE-AREA/WAFER-SCALE CMOS-COMPATIBLE 2D-MATERIAL DOPING TOOLS, PROCESSES, AND METHODS, INCLUDING DOPING OF SYNTHESIZED GRAPHENE. The entire contents of the foregoing applications are incorporated herein by reference.

BACKGROUND

Solid-phase diffusion of atoms in a "material stack" forming a "diffusion-couple" can be leveraged to synthesize high-quality thin-films at relatively low temperatures, needed in a wide range of applications covering microelectronics, optoelectronics, bioelectronics, quantum computing, and many more. However, enabling such solid-phase diffusion assisted thin-film growth; particularly over large "wafer-scale" (e.g. 150 mm, 200 mm, 300 mm, etc.) substrates, and within reasonable growth times, require design and fabrication of novel apparatus, or may utilize existing commercial (current or past) equipment with or without minor or major modifications, that can allow uniform application of a wide range of temperatures and pressures over the entire surface area of the semiconductor wafer or any other substrate forming the diffusion-couple. A core component of such an apparatus is a reactor that is not only capable of hosting such large area substrates but also allow a chemically purged environment, heated large-area substrates with near-zero temperature non-uniformity, as well as mechanisms to apply relatively large and uniform mechanical pressures (e.g., up to 1000 psi, etc.) to the diffusion-couple. It is noted that in some examples, atmospheric pressure can be utilized.

An imminent need for such a large-area diffusion-couple is in the emerging field of atomically-thin two-dimensional (2D) materials, particularly graphene or multi-layered-graphene (MLG) (essentially a single or multiple atomic layers of carbon atoms arranged in a hexagonal lattice), that must be directly synthesized over a desired substrate (typically a dielectric or a metal) without the need for a transfer-step that is considered unfeasible and cost-ineffective in the mainstream electronics (or CMOS) industry. Such graphene/MLG layers are preferred materials in several back-end-of-line or BEOL (refers to process steps in chip manufacturing after the formation of the active devices such as transistors and diodes) applications, particularly on-chip interconnects. However, BEOL interconnects must be synthesized under a strict thermal budget of <500° C. to avoid any damage to the underlying active devices (e.g. transistors, diodes, etc. via increased diffusion of impurities), and/or underlying interconnect layers and levels which may comprise materials, for example, such as Aluminum, Copper, Cobalt, Ruthenium, alloys of these, 2-D materials, low dielectric constant (low-k) insulating materials, and such with low softening/diffusion temperatures, which may be compromised by exposure to temperatures above 500° C.

Recent advances in graphene/MLG synthesis at BEOL-compatible temperatures have brought to the forefront the utility of the diffusion-couple for graphene/MLG growth, where a layer of carbon-source (e.g. in the form of powder, slurry, or amorphous-carbon film, and such) deposited over a sacrificial metallic film (such as Nickel) lying over a SiO2/Si substrate forms the diffusion-couple. Application of appropriate mechanical pressure (65-85 psi) on the carbon source at a relatively low temperature (<450° C.) has been shown to be sufficient to allow high-quality graphene/MLG growth, albeit over relatively small (1-2 inches) substrates. Hence, to allow this technique to be integrated in the mainstream CMOS technology, a scaled up (150/200/300 mm) diffusion-couple apparatus needs to be designed and fabricated. This technique/apparatus is also extendable to a wide range of substrates of different geometries and configurations and to other applications that inherently require a low thermal budget (<500° C.).

In addition, utilization of pressure and temperature to synthesize large scale, single to multi-layer graphene is presented in this invention via use of hardware which applies both temperature and pressure simultaneously to a given carbon-source-material, metal based multilayer stack. Key components of hardware may include at least one mechanical pressure head and at least one heater (integrated within the process/reactor chamber or within the pressure heads) to raise the temperature of a substrate above room temperature.

Commercially available tools, for example, such as, wafer bonding tools, hot-press based isostatic sintering systems, hot isostatic press (HIP), hot pressure vessels, and similar can be utilized.

SUMMARY OF THE INVENTION

In one aspect, a method of forming transistor interconnects on top of a semiconductor device substrate, the method including providing a semiconductor device substrate, where the semiconductor device substrate includes CMOS transistors and an inter-layer dielectric, where the inter-layer dielectric is atop the CMOS transistors, and where the inter-layer dielectric includes $SiO_2$ (Silicon dioxide); depositing a metal catalyst layer atop the inter-layer dielectric, where the metal catalyst layer includes Ni (Nickel), or Co (Cobalt), or Ru (Ruthenium), or Mo (Molybdenum); depositing a diffusion material atop the metal catalyst layer, where the diffusion material includes carbon; then loading the semiconductor device substrate into a process chamber, where the process chamber includes a heatable bottom platen which is heated to a specified temperature; placing the semiconductor device substrate on the heatable bottom platen, where the process chamber includes a heatable top platen, where the heatable top platen is configured to move up and down to apply a mechanical pressure to the semiconductor device substrate on the heatable bottom platen, applying the mechanical pressure, where the mechanical pressure is greater than 30 psi and less than 1000 psi; and then forming graphene, where the graphene is disposed at an interface of the inter-layer dielectric and the metal catalyst layer, and where the process chamber is a part of a modified or unchanged commercial bonding tool, hot-press tool, or pressure and temperature-controlled reactor.

BRIEF DESCRIPTION OF THE DRAWINGS

The present application can be best understood by reference to the following description taken in conjunction with the accompanying figures, in which like parts may be referred to by like numerals.

Figure 1:
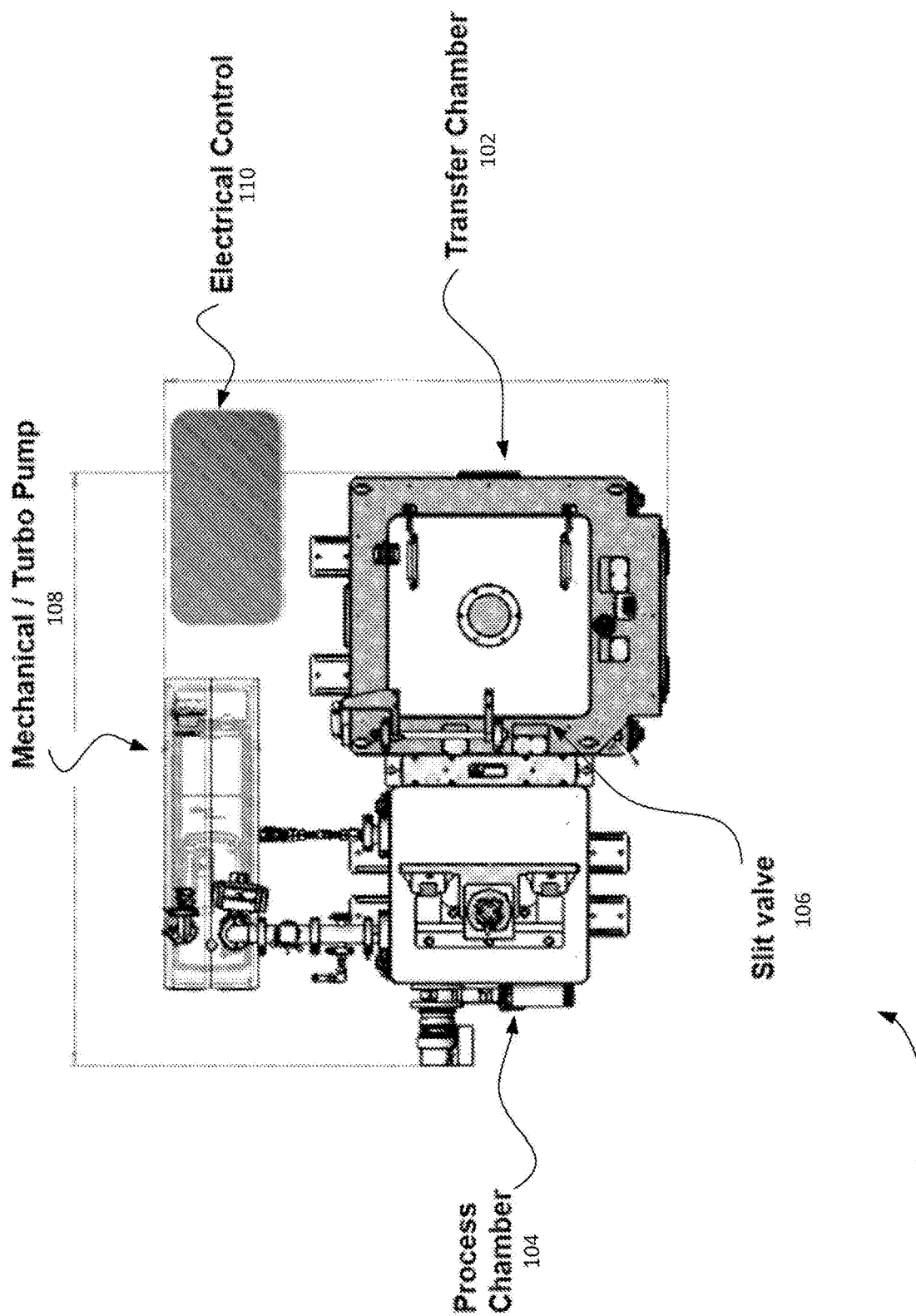
FIG. 1 illustrates an example top-view of the graphene process and transfer chambers of a graphene synthesis tool, according to some embodiments.

The Figures described above are a representative set and are not exhaustive with respect to embodying the invention.

DESCRIPTION

Disclosed are a system, method, and article of manufacture for low-temperature/BEOL-compatible highly scalable graphene synthesis tool. In addition, commercially available tools such as wafer bonding tools, hot-press based isostatic sintering systems, hot isostatic press (HIP), hot pressure vessels, and the like may be utilized. The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments.

Reference throughout this specification to "one embodiment," "an embodiment," "one example," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Back-End-Of-Line (BEOL) is the second portion of IC fabrication process where interconnects and other circuit elements are formed between and over the individual devices (primarily the transistors) on the wafer (e.g., the metallization layers) separated by intra-layer and/or inter-layer insulators.

Complementary metal-oxide-semiconductor (CMOS) is a type of metal oxide-semiconductor field-effect transistor (MOSFET) fabrication process that uses complementary and many times electrically symmetrical pairs of p-type and n-type MOSFETs for implementing at least logic functions.

Grain boundary (GB) is the interface between two grains and/or crystallites in a polycrystalline material.

Graphene is an allotrope of carbon consisting of a single layer of atoms arranged in a two-dimensional honeycomb lattice.

Graphene nanoribbons (GNRs) are strips of graphene with a width less than about one-hundred (100) nm.

Graphite is a layered crystalline form of the element carbon with its atoms arranged and covalently bonded forming a hexagonal structure within the layers.

Intercalation doping: Intercalation is when a molecule or ion inserts reversibly between the layers of a compound (such as potassium ions between graphite layers). Doping is adding impurities into a material. The dopant (impurity ion) will incorporate into the material's lattice. N-type dopants will donate electrons to the material. P-type dopants will accept electrons from the material. This will change the charge carrier density and consequently the electronic properties of the material.

Intercalation doping agents: There are many in the literature. Specific to graphene is recent work by Kaustav Banerjee, et al.; for example, J. Jiang, Jae Hwan Chu, and Kaustav Banerjee, "CMOS-Compatible Doped-Multilayer-Graphene Interconnects for Next-Generation VLSI," IEDM 2018, pp. 799-802, 34.5.1-4; and J. Jiang, et al., "Intercalation doped multilayer-graphene-nanoribbons for next-generation interconnects," Nano Letters, vol. 17, no. 3, pp. 1482-1488, 2017.

Piezoelectricity is the electric charge that accumulates in certain solid materials in response to applied mechanical stress.

Resistance temperature detectors (RTDs) are sensors used to measure temperature by monitoring the change in the electrical resistance of a conductor with temperature. RTD elements can consist of a length of fine wire wrapped around a heat-resistant ceramic or glass core but other constructions are also used.

Silicon dioxide is an oxide of silicon and an insulator with the chemical formula SiO2.

Wafer is a thin slice of semiconductor (e.g., a crystalline silicon, germanium) used for the fabrication of integrated circuits, etc.

Example Low-Temperature/Beol-Compatible Highly Scalable Graphene Synthesis Tool

It is noted that the following example embodiments discuss a graphene source by way of example. However, other carbon-sources (including carbon carrying compounds) can be utilized in other example embodiments.

FIG. 1 illustrates an example top-view of the graphene process and transfer chambers of a carbon-source synthesis tool 100, according to some embodiments. It is noted that in other example embodiments, other diffusion materials (other elements in the periodic table suitable for a specific diffusion metal and application) than carbon-sources can be utilized. Carbon-source synthesis tool 100 can be a low-temperature/BEOL-compatible scalable graphene (and/or other carbon source) synthesis tool. Carbon-source synthesis tool 100 includes transfer chamber 102. Transfer chamber 102 is used to load the wafer/substrate. The wafer/substrate can be of various sizes (e.g. 300 mm, 200 mm, 150 mm, etc.). An operator/user can place the wafer/substrate in transfer chamber 102. The transfer chamber 102 is then closed and sealed. The pressure of the transfer chamber 102 is equalized with the pressure of the process chamber 104. Once the pressure is equalized, the wafer/substrate is then pushed to the process chamber 104. It is noted that the wafer/substrate can be returned to the transfer chamber 102 after implementation of the deposition and other fabrication methods.

It is noted that some process schemes involve two or more wafers/substrates per position (i.e. one wafer/substrate on top of the other on top of another and so on, generally (but not necessarily) with the active 'top' of the wafer/substrate facing outwards, towards each platen/disk) in the apparatus, where the heat and compression acceleration can be applied to the two or more wafers/substrates simultaneously and thus synthesize the graphene on all of the wafers/substrates.

The process chamber 104 and the transfer chamber 102 are connected via a slit valve 108. Slit valve 108 may be opened once the pressures inside the two chambers are equalized.

The process chamber 104 is the main chamber (or reactor) for growth of graphene (and/or other carbon material) on the wafer and/or the application of temperature and pressure to form the diffusion-couple and ultimately high-quality graphene at the desired surface. A slightly larger than 300 mm sized substrate is located in the process chamber 104 (e.g. see heated bottom substrate 208). Process chamber 104 is equipped with a heater system. A heated top plate or disk is located in the process chamber 104 as well (e.g. see heated top substrate 206). The heated top disk has its own heating mechanism as well (e.g. see heating power supply 202). In this way, both the lower disk on which the wafer is placed and the heated top disk can be heated independently or synchronously. For example, the lower disk can be heated and the top disk can be kept at approximately room temperature (or vice versa). The liner surfaces (covering the disks) can be made of graphite, though other materials such as aluminum nitride, quartz, silicon carbide coated graphite, etc. can be employed. Several such materials are possible—generally speaking materials which permit good heat transfer and distribution of pressure can be considered. Flatness and surface finish of the liner can be a key factor to ensure appropriate heat and pressure distribution.

Mechanical/turbo pump 108 can be used to control pressure in process chamber 104 and/or transfer chamber 102. Mechanical pump(s) can be used to lower pressure in process chamber 104 (e.g. $10^{-3}$ torr). The turbo pump can be a more powerful pump that is used to lower the pressure even further (e.g. $10^{-7}$ torr). Low pressure is desired to purge the chamber of any impurities during the operation of the diffusion-couple.

Electrical control 110 can be used to operate carbon-source synthesis tool 100. Electrical control 110 can include computer processor(s) and software systems. Users can input commands, view status of various operations of carbon-source synthesis tool 100, etc.

Figure 2:
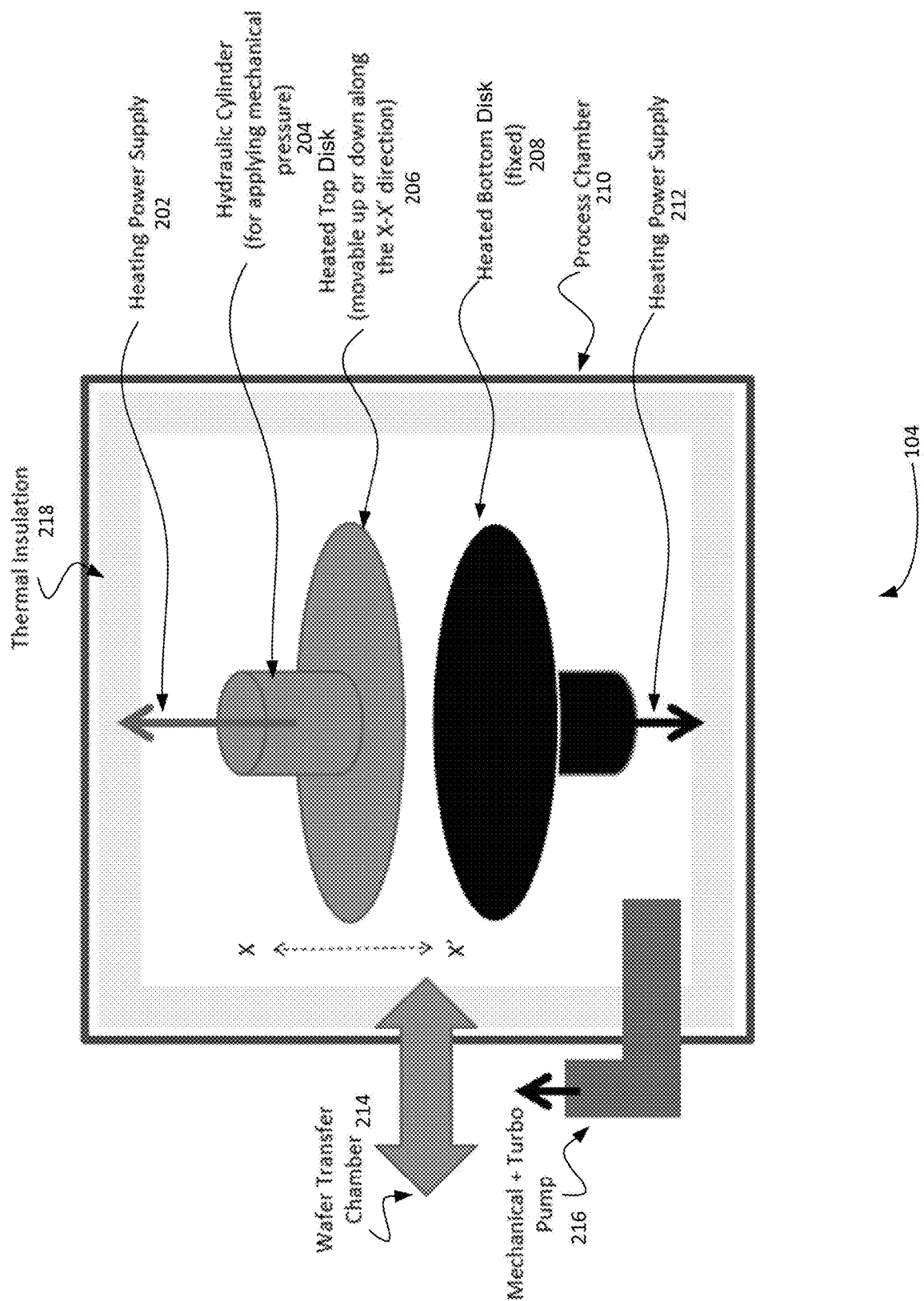
FIG. 2 illustrates an example schematic view of the internal elements of a process chamber, according to some embodiments.

FIG. 2 illustrates an example schematic view of the internal elements of process chamber 104, according to some embodiments. Wafer transfer chamber 214 provided shows transfer of the wafer back and forth to transfer chamber 102 from process chamber 104. Heated bottom disk 208 can be fixed in position and can be heated to a specified temperature (e.g. 500° C., etc.). Heat power supply 220 can maintain heat on the heat bottom disk 208. This can be done with a ±3° C. uniformity (and/or near-zero non-uniformity) across the heat bottom disk 208. Heated top disk 206 can move up and down along an x and x prime axis. Heated top disk 206 has an independent heating supply (e.g. heat power supply 202). Heated top disk 206 can be operated with hydraulic cylinder 204, a motor, and the like. Heated top disk 206 can be moved to provide mechanical pressure. By way of example, this pressure can be 50 to 125 psi, or more. The wafer is inserted on top of heated bottom disk 208. While the heated top disk 206 applies mechanical pressure to the diffusion-couple while the chamber pressure is maintained at a low value. This pressure can be for example, $10^{-6}$ to $10^{-7}$ torr to prevent contamination of the growth process. Chamber pressure can be regulated by mechanical/turbo pump 216 and associated equipment, sensors, and software.

An example operation of process chamber 104 is now discussed. Process chamber 104 can be used to deposit/grow a number of layers (e.g. monolayer or few-layer graphene (FLG) structures, or multi-layer graphene (MLG) structures). To grow graphene, a carbon/graphene source is deposited on a thin film of nickel (e.g., 100 nm in thickness). The graphene source (and/or other carbon-source) can be, inter alia: a graphite powder, a liquid/slurry form as a solvent with graphite, a layer of amorphous carbon deposited on nickel. Different deposition methods and tools can be utilized to deposit the thin film of nickel followed by the carbon source deposition on top of the nickel. The nickel, or other diffusion layer, may include thicknesses for example, such as, about 50 nm, about 75 nm, about 100 nm, about 150 nm, about 200 nm, about 250 nm, about 300 nm, and the like. The applied mechanical pressure breaks up the carbon/graphene source into carbon atoms, which then diffuse through the nickel and then recombine on the other side of the nickel film on top of the target substrate (for example, such as, a dielectric layer on a Si wafer). Once the formation of the desired number of graphene layers is completed, the nickel film and the remains of the carbon source are then removed.

Figure 3:
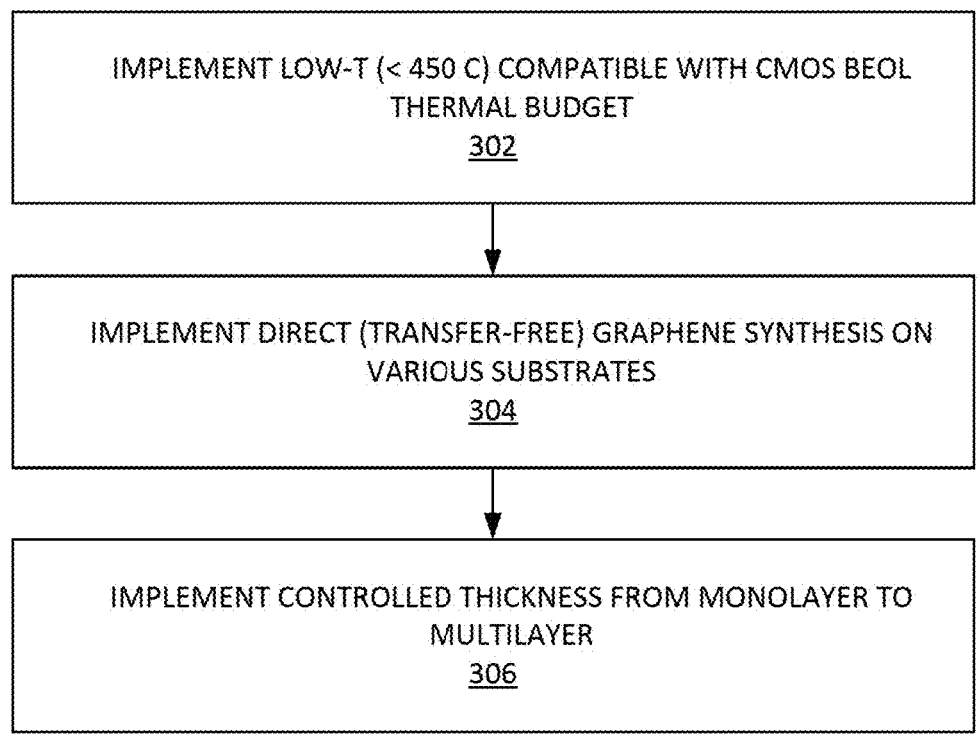
FIG. 3 illustrates an example graphene synthesis tool process, according to some embodiments.

FIG. 3 illustrates an example graphene synthesis tool process 300, according to some embodiments. Graphene synthesis tool process 300 can be used to operate carbon-source synthesis tool 100 or any of the other equipment/apparatus disclosed or suggested herein. Graphene synthesis tool process 300 can grow graphene at relatively low temperatures (e.g. 300-450° C., etc.). It is noted that when process chamber 104 is below ~450° C. then it can be compatible with a CMOS/BEOL thermal budget. BEOL are process steps that take place after front-end-of-line transistors are fabricated. Once a fabrication process has built the transistors on the wafer, the subsequent processing steps should be within the ~450° C. thermal budget to avoid damage to the transistors and various junctions that may lead to shorts and reliability issues.

Graphene synthesis tool process 300 may synthesize graphene while the number of graphene layers can be controlled by adjusting process parameters. Graphene synthesis tool process 300 can directly grow on top of any substrate (e.g. dielectric/Si substrate, metallic substrate, etc.). Graphene synthesis tool process 300 can synthesize graphene to thin/few layer coating of a metallic substrate as well.

More specifically, in step 302, graphene synthesis tool process 300 can implement low-temperature (e.g. <450° C.) graphene films compatible with a CMOS/BEOL thermal budget. In step 304, graphene synthesis tool process 300 can implement a direct (e.g. transfer-free) graphene synthesis on various substrates. In step 306, graphene synthesis tool process 300 can implement controlled thickness from monolayer to multilayer.

Figure 7:
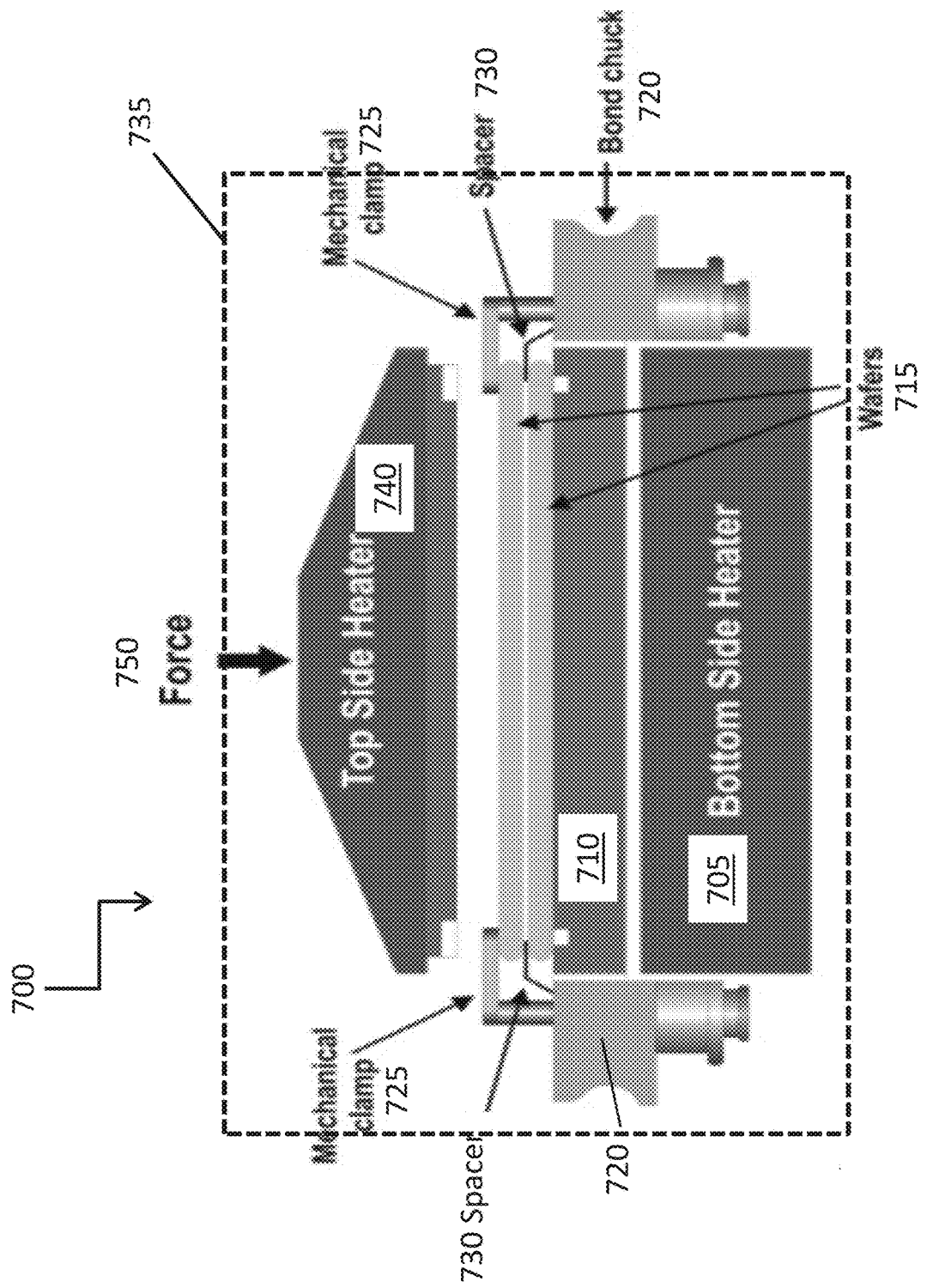
FIG. 7 illustrates an example side-view illustration of a commercial bonding tool, which may be utilized as a graphene process chamber(s), or more, of a carbon-source synthesis tool, according to some embodiments.

Example Retasked Tools for
Low-Temperature/Beol-Compatible Highly Scalable
Graphene Synthesis FIG. 7 illustrates an example side-view of a commercial bonding tool 700, which may be utilized as a graphene process chamber(s), or more, of a carbon-source synthesis tool, according to some embodiments. Commercial bonding tool 700 may include Bottom Side Heater 705, Bottom Side Bonding Platen 710, or a heatable chamber, wafers to be bonded 715 (which may now be replaced with synthesis substrates as utilized herein and incorporated references), Bond Chuck(s) 720, Mechanical Clamp(s) 725, Spacer(s) 730, Top-Side Heater 740, and Bonding Force 750 (which may now be a synthesis accelerating force).

Bottom Side Heater 705 and Top-Side Heater 740 may be controlled separately, or the entire chamber can be heated, typically up to 500° C., or in tandem depending on engineering, design, and logistical considerations. Radial temperature control may also be outfitted to facilitate a more uniform final bonding or synthesis result. Bonding pressure, via at least Bonding Force 750, can typically achieve up to 200 kN, and radial pressure adjustment may be designed into the surfaces and forces applied. This force adjustment capability can be used to advantage for controlling synthesis acceleration and the uniformity of that synthesis acceleration.

An example a bonding method may include: Loading wafers/substrates 715 to be bonded into commercial bonding tool 700, providing for temperature equilibration to a desired profile, aligning one wafer to the other (depending on the type of processing desired; for example, to mm level, sometimes to nanometer level), perhaps repeating the align/equilibrate steps, soft bonding by applying a small Bonding Force 750, checking alignment, then applying the full desired Bonding Force 750 at the desired temperature and for the desired time, cooling the processed synthesis wafer/substrate in the desired profile, which affects the resultant wafer-to-wafer stack stress and across the wafer/substrate 715 uniformity of alignment (alignment of wafer to wafer in bonding situations).

An example carbon-source synthesis process (a single wafer process is described) may include: Preparing the wafer/substrate 715 (generally singular in this case, depending on engineering and machine design and other considerations) by depositing the layers of material described herein and within incorporated references for facilitating a carbon-source synthesis process, loading wafer/substrate 715 into commercial bonding tool 700, providing for temperature equilibration to a desired profile, for single wafer synthesis process the alignment time-consuming sub-steps may not be necessary and thus save process time, applying the full desired synthesis Force 750 at the desired temperature and for the desired time, cooling the processed synthesis wafer/substrate 715 in the desired profile, which for synthesis is much shorter than for most bonding cases.

It is noted that some process schemes involve two or more wafers/substrates per position (i.e. one wafer/substrate on top of the other on top of another and so on, generally (but not necessarily) with the active 'top' of the wafer/substrate facing outwards, towards each platen/disk) in the apparatus, where the heat and compression acceleration can be applied to the two or more wafers/substrates simultaneously and thus synthesize the graphene on all of the wafers/substrates. This, in some ways, is similar to the bonding process scheme, where two wafers are 'stacked' and then aligned, then bonded, whilst within the bonding apparatus.

Commercial bonding tool 700 may include an apparatus and software (not shown) which facilitates alignment of the two wafers 715 (or synthesis substrates, which may be 2 or more). This may be accomplished via mechanical means or optical means, or a combination of both. This feature may be utilized, for example, to accomplish multiple wafer/substrate synthesis of the desired layer, such as FLG/MLG.

Commercial bonding tool 700 may include an apparatus and software which facilitates wafer-to-wafer, die-to-wafer, or die-to-die bonding. Carbon source synthesis, for example, of such as FLG/MLG, may also be accomplished on at least these substrates and structures.

Commercial bonding tool 700 (and other disclosed or suggested tools/apparatus/machines herein) may include modifications and use as an intercalation doping tool; the process, etc. is described in detail within at least incorporated reference U.S. patent application Ser. No. 18/527,043.

Figure 8A:
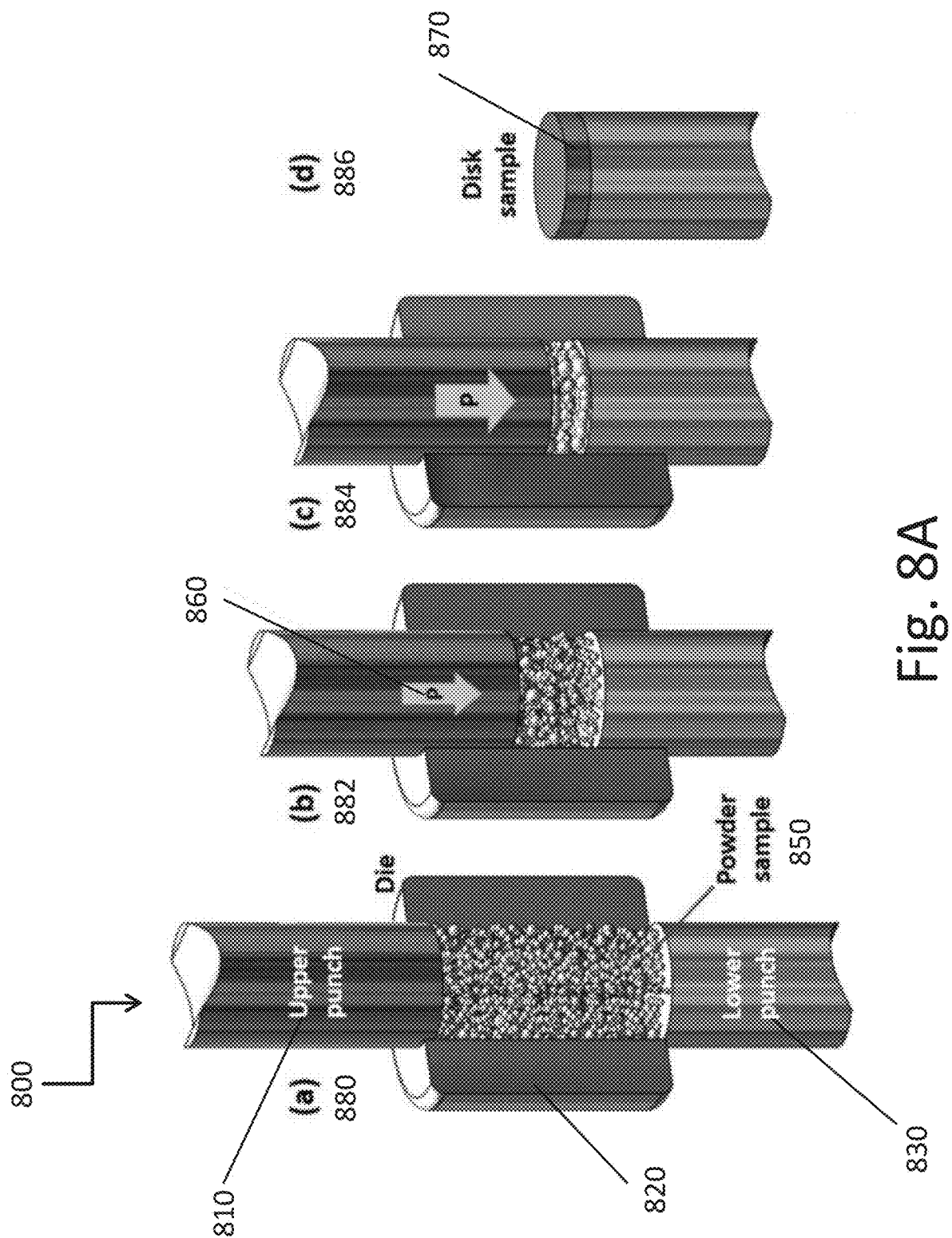
FIG. 8A illustrates an example side-view illustration of a commercial Isostatic Sintering apparatus, which may be utilized as a graphene process chamber(s), or more, of a carbon-source synthesis tool, according to some embodiments.

FIG. 8A illustrates an example side-view illustration of a commercial Isostatic Sintering apparatus 800, which may be utilized as a graphene process chamber(s), or more, of a carbon-source synthesis tool, according to some embodiments. Isostatic Sintering apparatus 800 may include Upper Punch/Press 810, Hot/Pressure Chamber Die/Shape 820, and Lower Punch/Press 830.

Upper Punch/Press 810 may include an integrated or non-integrated Upper Heater (not shown). Lower Punch/Press 830 may include an integrated or non-integrated Lower Heater (not shown). Upper and Lower heaters may be controlled separately, typically up to 500° C., or in tandem depending on engineering, design, and logistical considerations. Radial temperature control may also be outfitted to facilitate a more uniform final bonding or synthesis result. Upper Punch/Press 810 and Lower Punch/Press 830 may be actuated to provide pressure on Powder Sample 850 to form Disk Sample 870 via, for example, hydraulic means, screw leverage, and so on, depending on engineering, cost, speed and design concerns.

With appropriate modifications, wafers/substrates may be placed on the Lower Punch/Press 830 with a carbon source on the wafer/substrate already, or supplied within the chamber such as Powder Sample 850, and the graphene synthesis on the wafer/substrate may proceed as described. Radial temperature control may also be outfitted to facilitate a more uniform final sintering or synthesis result. Sintering/Synthesis Force 860 pressure, via at least Sintering/Synthesis Force 860, can typically achieve up to 1000 kN, and radial pressure adjustment may be designed into the surfaces and forces applied. This force adjustment capability can be used to advantage for controlling synthesis acceleration and the uniformity of that synthesis acceleration.

Hot/Pressure Chamber Die/Shape 820 may include a circular shape matching or slightly larger or than the Desired Substrate. The shape of Hot/Pressure Chamber Die/Shape 820 may include rectangles and so on to match the Desired Substrate shape. Volume of Hot/Pressure Chamber Die/Shape 820 may be modified due to engineering and process considerations; for example, such as use of a gaseous carbon (or doping) source.

For an exemplary isostatic sinter processing, Isostatic Sintering apparatus 800 may include an initial condition (a) 880, wherein Powder Sample 850 may be loaded into the Hot/Pressure Chamber Die/Shape 820 which may be heated for temperature acceleration, and then compressed by moving Upper Punch/Press 810 towards Lower Punch/Press 830, thus reducing the volume of the process chamber and compressing Powder Sample 850. Heat, of course, may be generated by this compression of the initial volume and may need to be removed from the apparatus chamber to maintain temperature uniformity and/or may be used to accelerate any reactions and phase changes desired. In step (b) 882, Force 860 may be applied and move Upper Punch/Press 810 towards Lower Punch/Press 830, thus making chamber volume smaller, compressing the material within. Step (c) shows the exemplary final position of Upper Punch/Press 810, the apparatus 800 which has now created disk sample 870 as shown in step (d).

For an exemplary graphene synthesis processing using a commercial or research Isostatic Sintering apparatus, for example exemplary Isostatic Sintering apparatus 800, this processing may include an initial condition (a) 880, wherein a wafer/substrate (not shown) may be loaded into the Hot/Pressure Chamber Die/Shape 820, may be placed on Lower Punch/Press 830 within the process chamber, which may be heated for temperature acceleration, and then compressed by moving Upper Punch/Press 810 towards Lower Punch/Press 830, thus reducing the volume of the process chamber and compressing Powder Sample 850. The wafer/substrate, as described previously herein and in incorporated references, may include a carbon source material/layer disposed on top of a diffusion material (such as Ni), which may be disposed above a dielectric (such as an inter-metal dielectric, silicon oxide, low-k materials, and such) which may have 2D or 3D stacks/circuitry underneath. The carbon source for the graphene synthesis may also be supplied in various forms, such as gaseous hydrocarbons, disposed in the process chamber above the wafer/substrate. Heat, of course, may be generated by this compression of the initial volume and may need to be removed from the apparatus chamber to maintain temperature uniformity and/or may be used to accelerate any reactions and phase changes desired. In step (b) 882, Force 860 may be applied and move Upper Punch/Press 810 towards Lower Punch/Press 830, thus making chamber volume smaller, compressing the carbon source material and encouraging diffusion through the diffusion layer to form graphene on the surface f the exemplary dielectric. Step (c) shows the exemplary final position of Upper Punch/Press 810, the apparatus 800 as shown in step (d) where the 'Disk Sample' 870 is the wafer/substrate with remainder carbon source disposed on top of the diffusion layer (such as Nickel) disposed on top of the newly formed MLG, which is disposed on top of the exemplary dielectric of the wafer/substrate.

Figure 8B:
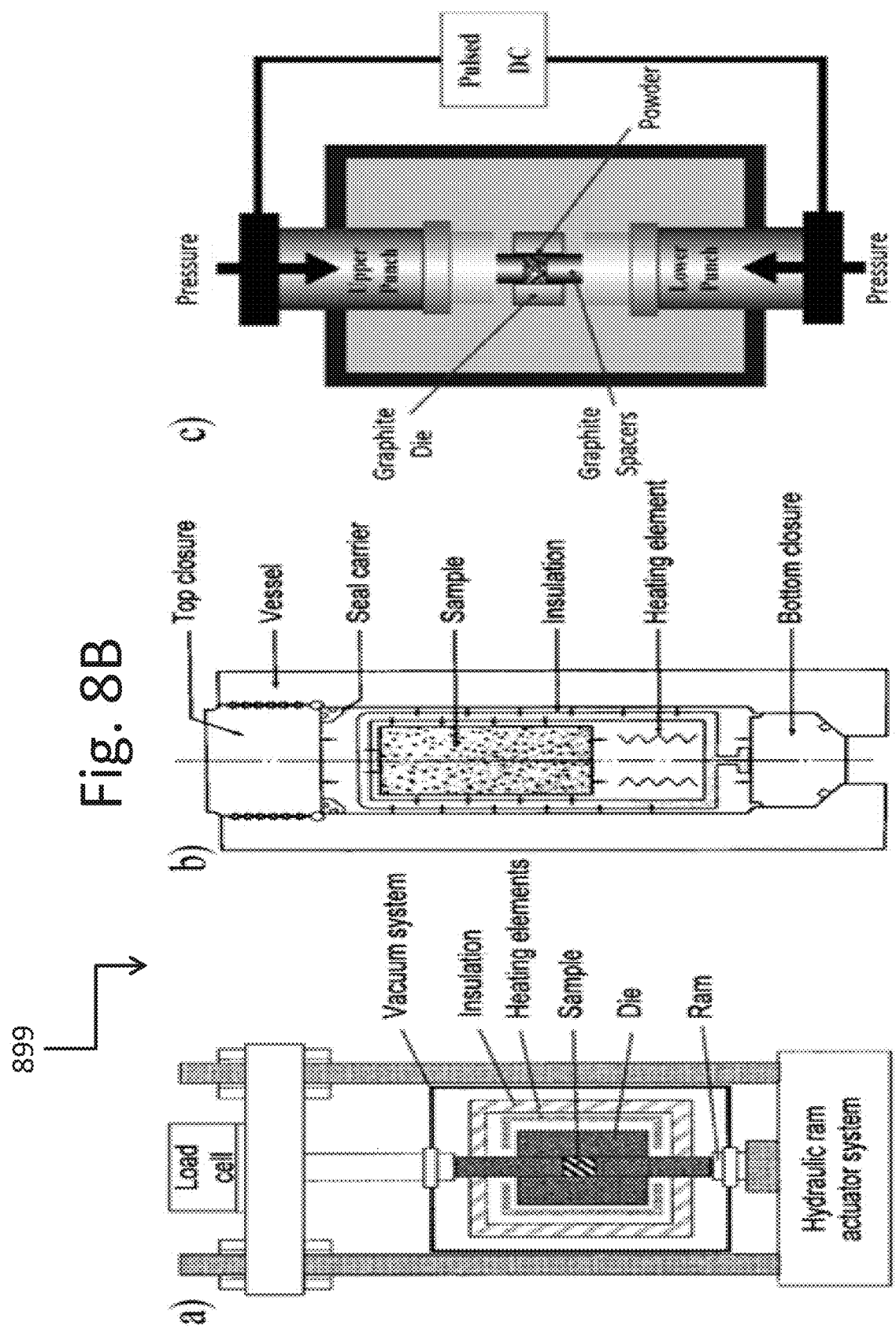
FIG. 8B illustrates an example side-view illustrations of other commercial and research Isostatic Sintering apparatus.

FIG. 8B illustrates an example side-view of other commercial and research Isostatic Sintering apparatus 899. There are many such configurations possible. The web reference is included on the figure drawing sheet. These machines can also be employed to supply the temperature and pressure acceleration for a graphene synthesis process. As well, not just wafer-to-wafer bonding, wafer graphene synthesis, and wafer intercalation doping can be realized, but also die-to-wafer and die-to-die bonding and similarly graphene synthesis, and intercalation doping can be realized.

Figure 9:
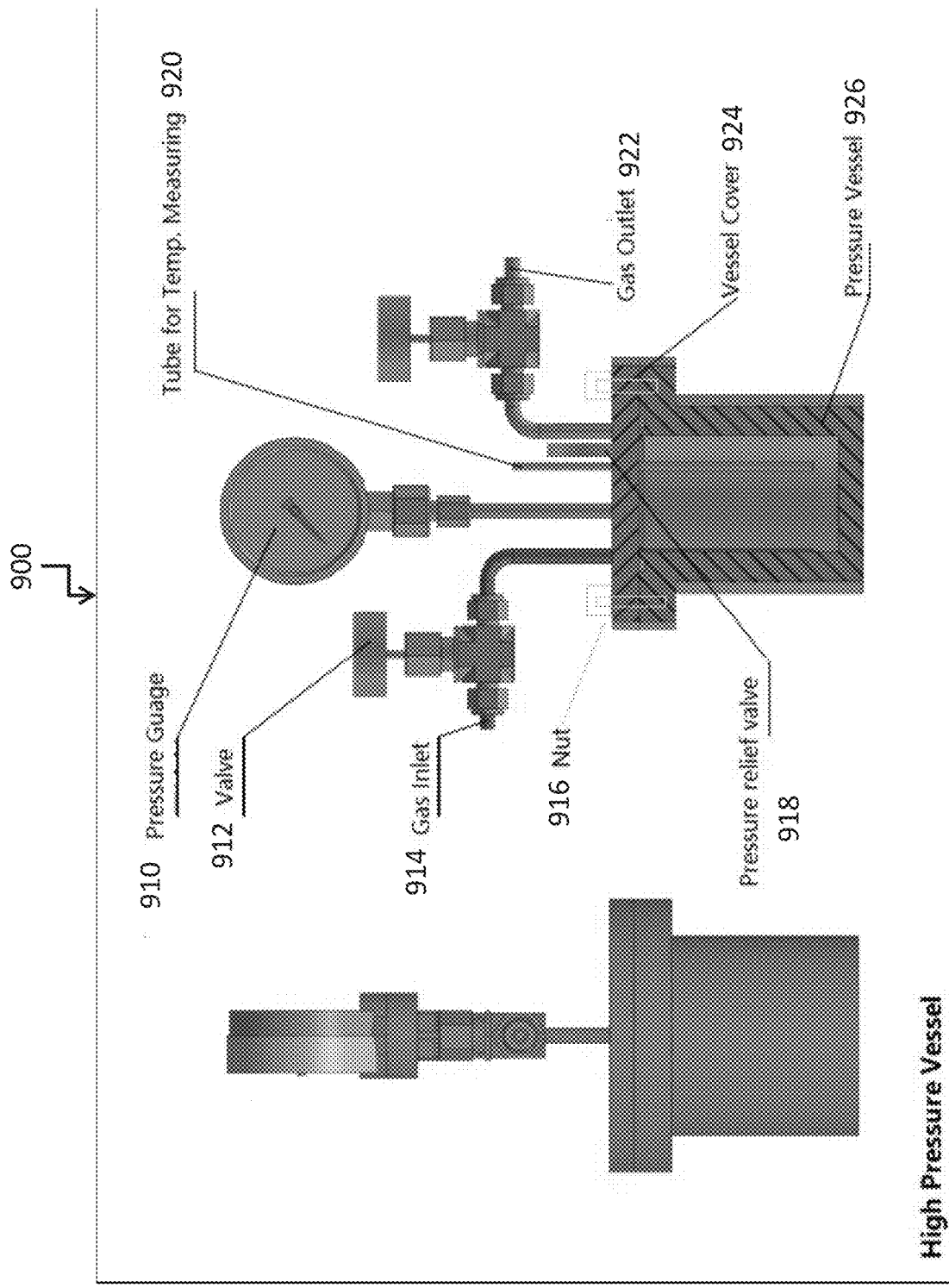
FIG. 9 illustrates an example side-view illustration of a commercial/research Hot Isostatic Press (HIP) apparatus, which may be utilized as a graphene process chamber(s), or more, of a carbon-source synthesis tool, according to some embodiments.

FIG. 9 illustrates an example side-view illustration of a commercial/research Hot Isostatic Press (HIP) apparatus 900, which may be utilized as a graphene process chamber(s), or more, of a carbon-source synthesis tool, according to some embodiments. HIP apparatus 900 may include Pressure Gauge 910, gas inlet Valve 912, Gas Inlet 914, Nut(s) 916, Pressure Relief Valve 918, Tube for Temperature Measuring 920, Gas Outlet 922, Vessel Cover 924, and Pressure Vessel 926. The HIP apparatus 900 utilizes high pressure gas to provide the compression acceleration for forming graphene, as well as temperature acceleration from heat supplied to the substrate and process chamber Pressure Vessel 926.

Process chamber Pressure Vessel 926 may include an integrated or non-integrated Heater (not shown). Vessel Cover 924 may include an integrated or non-integrated Lower Heater (not shown). Pressure Vessel 926 and Vessel Cover 924 heaters may be controlled separately, typically up to 500° C., or in tandem depending on engineering, design, and logistical considerations. Radial (with respect to the wafer/substrate) temperature control may also be outfitted to facilitate a more uniform final synthesis result. Gas inlet Valve 912 may be actuated to provide gaseous pressure through Gas Inlet 914 to process chamber Pressure Vessel 926, thus encouraging and accelerating graphene synthesis, or other synthesis processes.

With appropriate modifications to HIP apparatus 900, wafers/substrates may be placed within process chamber Pressure Vessel 926 with a carbon source on the wafer/substrate already, or supplied within the chamber such as at least a portion of the pressurization gas including a carbon containing component, and the graphene synthesis on the wafer/substrate may proceed as described herein and in incorporated references. Radial temperature control may also be outfitted to facilitate a more uniform final synthesis result. The gaseous pressure may constitute a force impinging on the wafer/substrate, can typically achieve up to 10,000 kN, and being a gaseous applied pressure, its radial pressure gradient should be close to zero, even when approaching a liquid phase. Hydraulic pressure, through liquids, may also be utilized in this type of machine, with the appropriate modifications to handle the viscous gas called liquid. This can capability can be used to advantage for controlling synthesis acceleration and the uniformity of that synthesis acceleration.

Pressure Vessel 926 may include a circular shape matching or slightly larger or than the desired substrate. The shape of Pressure Vessel 926 may include rectangles and so on to match the desired substrate shape, but may not necessarily so. As well, gaseous application of the pressure for this system may allow a simpler and more practical multiple-wafers-at-a-time processing and process chambers/Pressure Vessel 926 configurations. The interior shape of process chamber/Pressure Vessel 926 and potential gaseous distribution manifolds within it may be modified due to engineering and process considerations; for example, such as use of a gaseous carbon (or doping) source.

For an exemplary graphene synthesis processing using a commercial or research HIP apparatus, for example exemplary HIP apparatus 900, this processing may include an initial condition wherein a wafer/substrate (not shown) may be loaded into the process chamber Pressure Vessel 926 which may be heated for temperature acceleration, and then compressed by opening Valve 912 and supplying the desired pressure of gas through Gas Inlet 914. The wafer/substrate, as described previously herein and in incorporated references, may include a carbon source material/layer disposed on top of a diffusion material (such as Ni), which may be disposed above a dielectric (such as an inter-metal dielectric, silicon oxide, low-k materials, and such) which may have 2D or 3D stacks/circuitry underneath. The carbon source for the graphene synthesis may also be supplied in various forms, such as gaseous hydrocarbons, disposed in the process chamber above the wafer/substrate. Heat, of course, may be generated by this compression and may need to be removed from the apparatus chamber to maintain temperature uniformity and/or may be used to accelerate any reactions desired. The gaseous pressure within process chamber Pressure Vessel 926 may include a higher than nominal atmospheric pressure, for example, such as, about 2 Bar gaseous pressure, about 5 Bar gaseous pressure, about 10 Bar gaseous pressure, about 50 Bar gaseous pressure, about 100 Bar gaseous pressure, and so on. Construction and support of process chamber Pressure Vessel 926 to provide a safe tool is well-known in the art. This gaseous pressure will compress the carbon source material and encourage diffusion through the diffusion layer (typically Nickel) to form graphene on the surface of the exemplary dielectric.

There are many such configurations possible. These machines can also be employed to supply the temperature and pressure acceleration for a graphene synthesis process. As well as for intercalation doping of 2D materials, for example, such as MLG structures.

Figure 10:
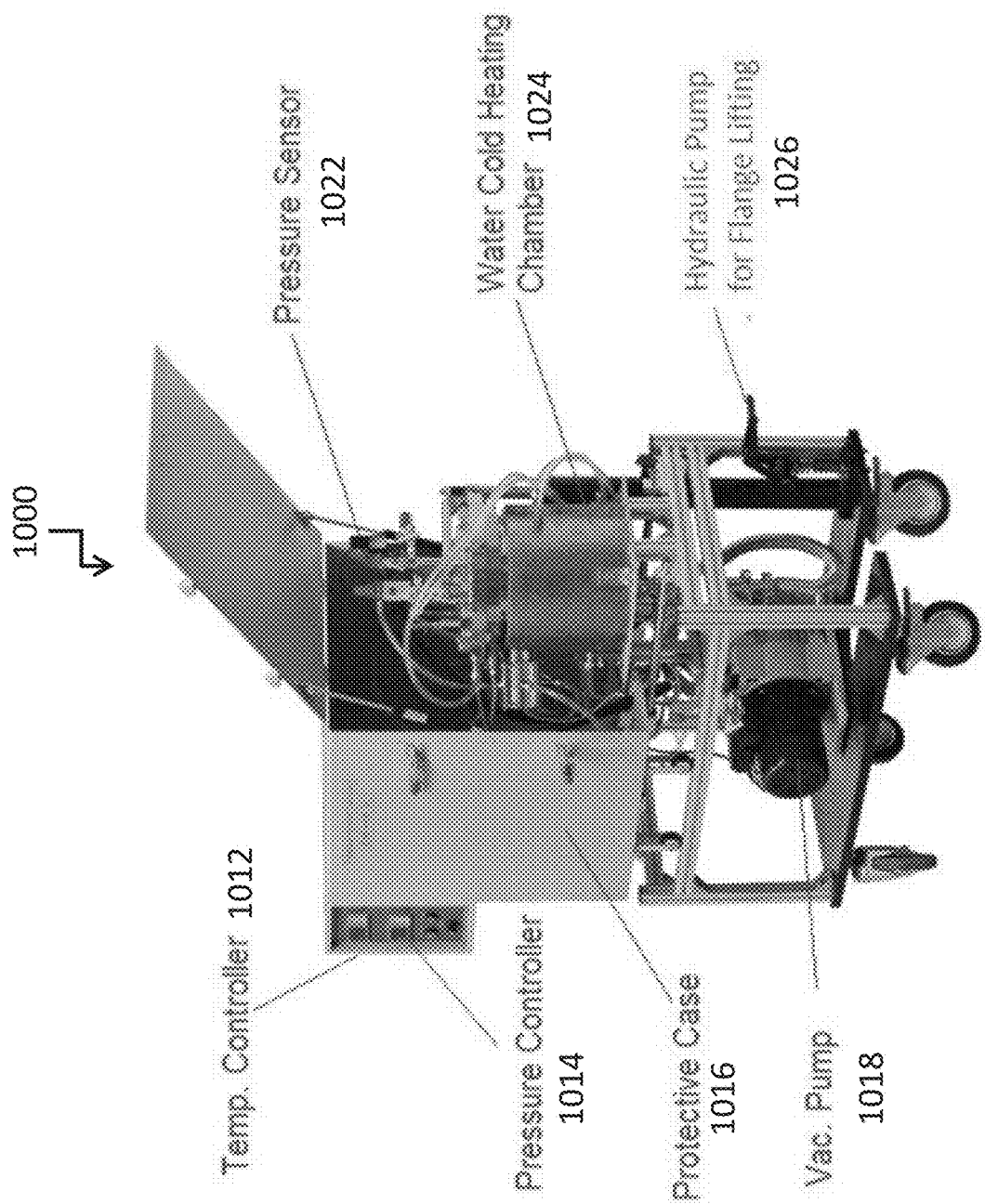
FIG. 10 illustrates an exemplary view of an alternative commercial and research Hot Pressure Vessel (HPV) apparatus design, which may be utilized as a graphene process chamber(s), or more, of a carbon-source synthesis tool, according to some embodiments.

FIG. 10 illustrates an exemplary view of an alternative commercial and research Hot Pressure Vessel (HPV) apparatus 1000 design, which may be utilized as a graphene process chamber(s), or more, of a carbon-source synthesis tool, according to some embodiments. HPV apparatus 1000 may include Temperature Controller 1012, Pressure Controller 1014, Protective Case 1016, Vacuum Pump 1018, Pressure Sensor 1022, Water Cold/Heating Chamber 1024, and Hydraulic Pump for Flange Lifting 1026. The HPV apparatus 1000 utilizes high pressure gas to provide the compression acceleration for forming graphene, as well as temperature acceleration from heat supplied to the substrate and process chamber Water Cold/Heating Chamber 1024.

There are many such configurations possible. These machines can also be employed (with or without any modifications) to supply the temperature and pressure acceleration for a graphene synthesis process. As well as for intercalation doping of 2D materials, for example, such as MLG structures.

Example Embodiments

An example embodiment can start with a wafer (e.g. Si/SiO$_2$), then deposit a thin film of a catalyst metal thin-film such as nickel. The morphology of the catalyst film can be tuned during the deposition or after deposition (e.g., via annealing etc.) to meet specific application needs. Then deposit a uniform distribution of carbon-source on top of Ni. A pressure of 65 to 85 psi is applied on the carbon-source. A disc with a diameter slightly larger than the 300 mm wafer can be used. The substrate (wafer) can be heated to 300° C. to 450° C. Once the pressure is applied, a portion of the carbon items diffuse through the Ni film. The carbon-source/Ni/SiO$_2$/Si can act as a diffusion-couple. The carbon atoms can recombine on the other side of the Ni (e.g., facing the SiO$_2$) to form a monolayer, few-layer, or multilayer graphene.

Various processing steps can then be implemented (e.g., removing remaining graphite, removing metal catalyst (Ni) layer, etc.).

Instead of an $SiO_2$, the substrate can be copper or another metal (such as cobalt, ruthenium, molybdenum, tungsten, or an alloy metal, etc.), or a low dielectric constant (low-k) material such as porous silicon-dioxide or hydrogen silsesquioxane (HSQ), or black diamond, etc., or even any patterned substrate formed with metals and dielectrics, etc. In this embodiment, the modification can include a sacrificial layer of amorphous carbon between the Ni and the Cu. In this way, the Ni and the Cu can be prevented from forming an alloy. In other examples, other metals can include, inter alia: Co, Ni, Ru (as both a substrate and/or a catalyst), molybdenum, etc., or a metal compound.

The thicknesses of the substrates and catalysts can be set (e.g. 100 nm, etc.). The number of layer(s) of graphene (i.e., its thickness) required can be a function of thickness of Ni along with other process parameters including time, temperature, pressure, and grain-size of the catalyst film.

The substrate wafer can be 300 mm or 200 mm or smaller/larger (450 mm). A temperature controller can be used to maintain the temperature anywhere from room temperature (~25° C.) to 500° C., or higher as long as process compatibility is met. The graphite powder can be spread in a uniform or pre-patterned manner. A chuck (disk) can be used to press down on the uniformly distributed graphite. Other carbon-containing compounds can also be used as a substitute.

Pressure on the substrate forming the diffusion-couple can be applied by means of mechanical force for instance by employing an instrument such as a chuck, or via any non-contact means such as increasing the substrate environment pressure by, for instance, using a gas pressure (1 bar to several 1000's of bars). A single substrate or multiple substrates as batches can be processed at once. In addition, the gas can be normal air or a specific gas such as Ar, N2 or a mixture of many such gases etc. As taught and suggested herein, there are many commercial and research machines/apparatus which may successfully run the graphene synthesis process disclosed; for example, such as commercial bonding tool 700, Isostatic Sintering apparatus 800, Hot Isostatic Press (HIP) apparatus 900, and Hot Pressure Vessel (HPV) apparatus 1000.

Application of heat can be from any source capable of generating a temperature on the substrate. In some embodiments, both the top disk and/or the bottom disk can be heatable. In some embodiments, the top substrate disk and/or the bottom substrate disk may not be heatable, and there can be another heat source such as, for example, the pressure chamber walls, etc.

Example Systems and Methods for Migration of a Deposition Material Across a Diffusion Couple Deposited on a Substrate to a Substrate Surface Example systems and methods can provide for the migration of a deposition material across a diffusion couple deposited on a substrate to the substrate surface. This approach provides many advantages for the deposition of the material.

Figure 4:
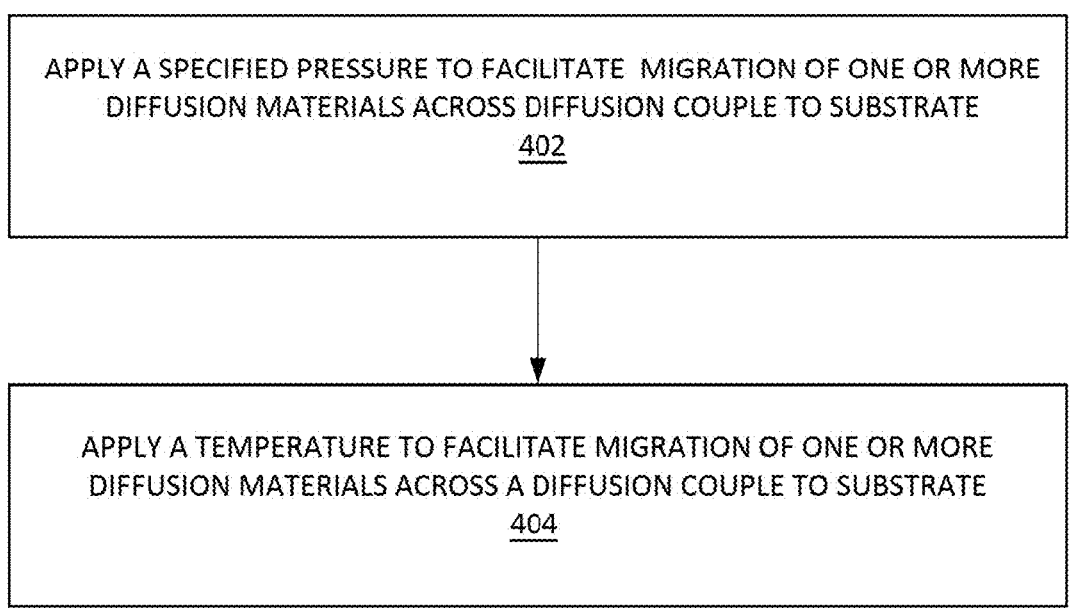
FIG. 4 illustrates an example high-level flowchart of a process for migration (e.g., diffusion) of a deposition material across a diffusion couple metal deposited on a substrate (e.g., Si wafer) forming a diffusion-couple, to the substrate surface, according to some embodiments.

FIG. 4 illustrates an example process 400 for migration of a deposition material across a diffusion couple deposited on a substrate to a substrate surface, according to some embodiments. Process 400 can use a reactor system to facilitate the migration of one or more diffusion materials across a diffusion couple to a substrate by implementing the following steps. In step 402, process 400 can apply a specified pressure to facilitate the migration of the one or more diffusion materials across the diffusion couple to the substrate. In step 404, process 400 can apply a temperature to facilitate the migration of the one or more diffusion materials across a diffusion couple to the substrate.

Figure 5:
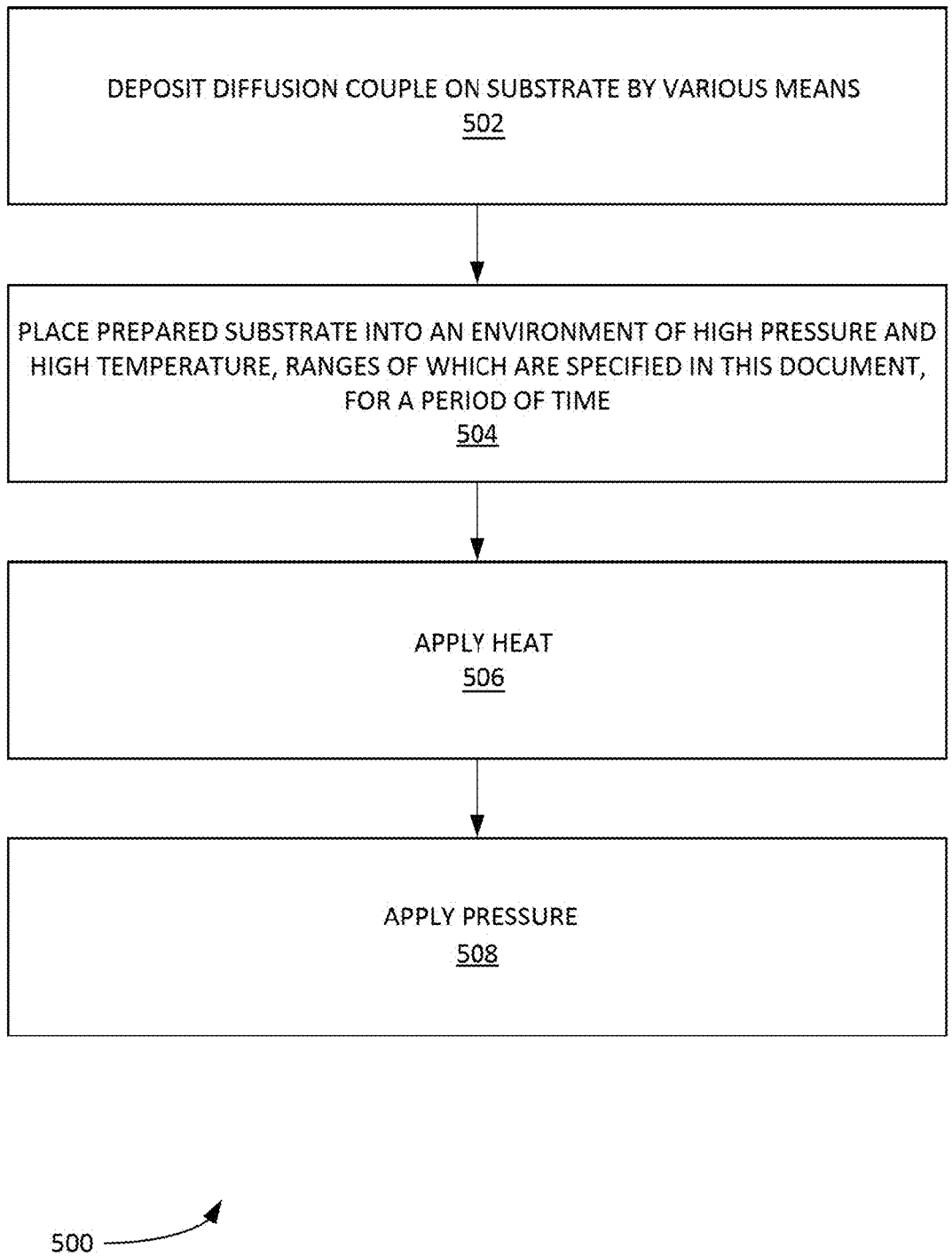
FIG. 5 illustrates another example high-level flowchart of a process for the migration of a deposition material across a diffusion couple metal deposited on a substrate to the substrate surface, according to some embodiments.

FIG. 5 illustrates another example process 500 for or migration of a deposition material across a diffusion couple deposited on a substrate to a substrate surface, according to some embodiments. Process 500 provides the ability to deposit a material that it may not be possible to deposit directly using conventional methods. For example graphene is not known to be directly synthesized on silicon. Process 500 permits this to be realized. It is noted that the grain and other material structures of the deposited material may be tailored by appropriately varying the structure of the diffusion couple and/or process conditions.

In step 502, process 500 deposits the diffusion couple on the substrate by various means, including the most commonly used ones and then depositing some form of the material to be deposited on the substrate on top of the diffusion couple. This may herein be referred to as the prepared substrate or the layer substrate.

In step 504, process 500 places the prepared substrate into an environment of high pressure and high temperature, ranges of which are specified in this document, for a period of time.

In step 506, process 500 can perform the application of heat is accomplished through, inter alia: resistive heating, radiative heating, gas heating and the like.

In step 508, process 500 can apply pressure as well. This can be implemented through, inter alia: mechanical means, through gas pressure, through flexible membranes, through liquid pressure, and the like.

Figure 6:
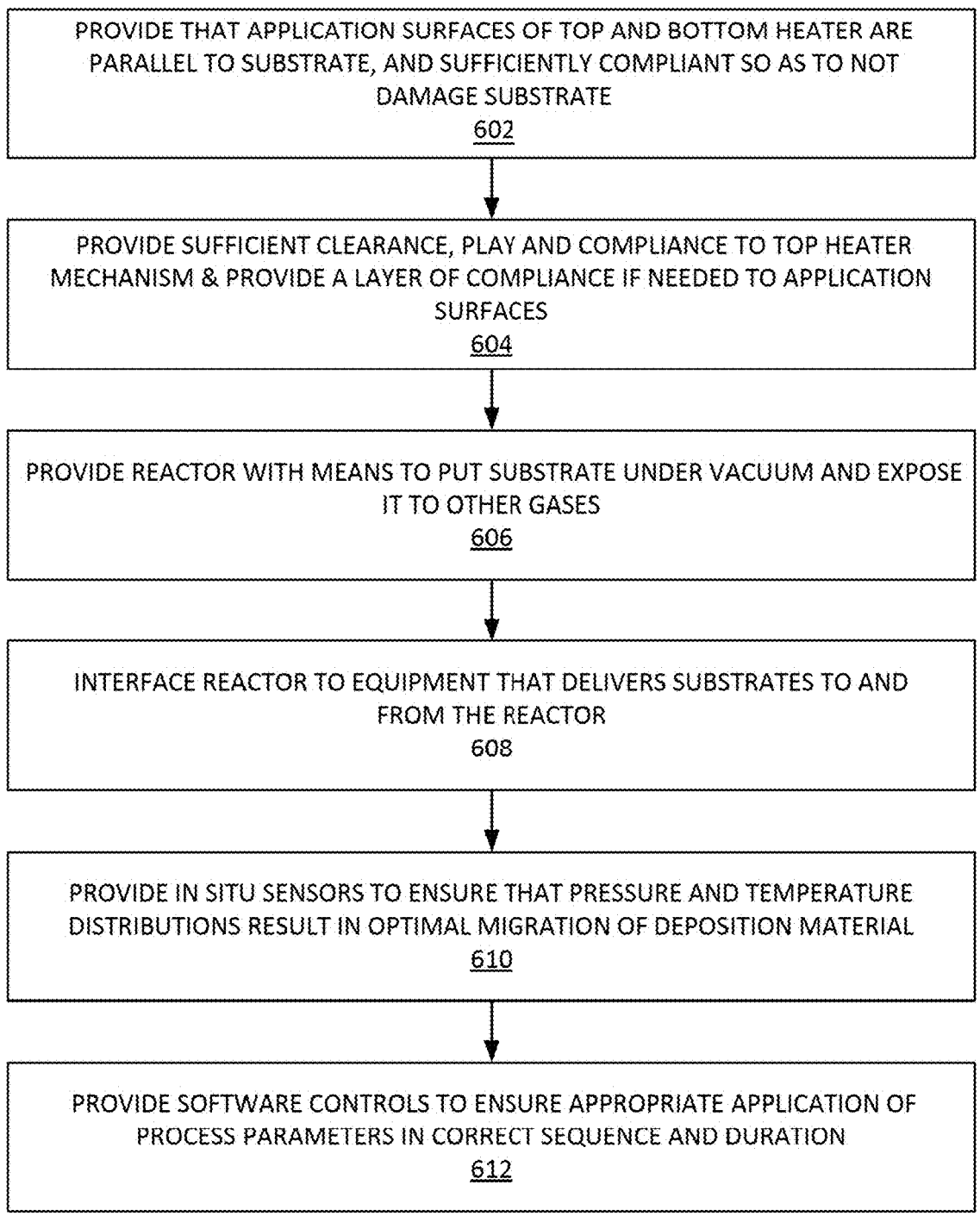
FIG. 6 illustrates an example high-level flowchart of a process that uses top and bottom heaters to compress and heat a substrate with uniform pressure and temperature, according to some embodiments.

Example Use Case: Reactor with Mechanical Application of Pressure and Direct Heating FIG. 6 illustrates an example process 600 that uses top and bottom heaters to compress a substrate with uniform pressure and temperature, according to some embodiments. Carbon-source synthesis tool 100 can be modified and/or otherwise used to implement the present example embodiment. The substrate is placed on a pedestal (e.g. disk) through means of a handler typical to the equipment industry. The pedestal has the ability to heat the substrate through direct contact. Note that the contact materials may be varied through use of appropriate liner materials. A top moving heater (embedded in a disk) then moves down and puts the substrate under pressure while at the same time heating it. When the process is completed, the substrate is returned out from the reactor (e.g. the process chamber of FIG. 2 supra, etc.).

In step 602, the application surfaces of the top and bottom heater are parallel to the substrate, and sufficiently compliant so as to not damage the substrate. This is accomplished by providing sufficient clearance and play and compliance to the top heater mechanism, as well as by providing a layer of compliance if needed to the application surfaces in step 604.

In step 606, the reactor may also be provided with the means to put the substrate under vacuum and expose it to other gases such as, inter alia, N2, Ar, He, and the like to optimize the process. Hence the reactor may be equipped with vacuum pumps as well as gas lines and a gas panel to ensure ability to put the substrate under various environments.

In step 608, the reactor may be interfaced to equipment that can deliver the substrates to and from the reactor. For example in the case of wafer processing the reactor may be attached to the facet of a transfer chamber that is equipped with a wafer handling robot that operates under high vacuum. In some examples, a slit valve can be provided to isolate the reactor from the rest of the system. A plurality of reactors may be attached to the transfer chamber to facilitate higher throughputs or production rates. There can also be reactors that deposit the diffusion couple including the source material attached to the transfer chamber, such as sputtering and CVD chambers, thereby permitting the creation of the layers on the substrate as well as the deposition of the final material on the same system.

In step 610, process 600 provides in situ sensors (e.g., in the reactor, etc.) to ensure that the pressure and temperature distributions in turn result in optimal migration of the deposition material across the diffusion couple. For example the pressure can be calibrated and monitored through the use of a pressure sensor on the step of the pedestal, through monitoring of the current drawn by the motor applying the pressure between the surfaces, through use of flexures configured as strain gauges embedded in the liner material and the like. Likewise the temperature can be monitored using thermocouples and RTDs mounted in the pedestals, use of IR sensors, phosphorus-based sensors, and the like.

In step 612, process 600 provides software controls to ensure appropriate application of the process parameters in the right sequence and duration.

Other configurations of the reactor that apply other forms of heat and pressure on the substrate are now discussed. It is noted that the aforementioned configuration is just one of many. Alternate configurations could include, inter alia:

- Heated membraned subject to high pressure (either pneumatic or hydraulic for example);
- Clamshell configurations with high temperature and high pressure heated N2, Ar, other such gases;
- Large batch reactors with the same characteristics as discussed supra;
- Clamshell in which combinations of the previously detailed approaches to heating and applying pressure to the substrates may be used. For example, high temperature and pressure gas could be fed in; high pressure could be fed in with the bottom heater being used to heat the substrate, bottom heater heats high temperature gas to accomplish the pressure function and maintain temperature, and so on;
- Quartz body with substrate placed on a susceptor and inductively heated and pressure loading accomplished using high pressure gas; and
- May also include an array of lamps in a quartz body for final temp control.

By way of example, the reactors outlined above facilitate the deposition of materials through diffusion couples, as in the use of deposition of graphene onto a silicon wafer across a nickel layer. The deposition method using diffusion couples can be applied to a wider range of deposition materials and diffusion materials.

The following sections provide certain ranges of operation for the system, as well as parameter ranges for desired material structures, composition, and the like for optimal process results.

As noted earlier the use of this method to permit migration of one material across a diffusion couple permits deposition of a material on substrate where it may previously not have been possible through other traditional deposition methods (e.g., graphene is difficult to grow directly on Si or SiO2).

The systems described here facilitate the growth of graphene on Si/SiO2 by application of pressure and temperature on the carbon source deposited on a Ni layer that is in turn deposited on the Si wafer, etc.).

It is noted that the reactor can be implemented as a batch reactor and/or single substrate (wafer) reactor. It is noted that in single substrate configurations finer substrate to substrate process control than with a batch reactor can be accomplished. A method of creating a batch process with a single wafer architecture can also be realized by employing a stack of wafers between the two heaters.

Conclusion

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

We claim:

1. A method of forming transistor interconnects, the method comprising:
   providing a first semiconductor device substrate and a second semiconductor device substrate, said first semiconductor device substrate and said second semiconductor device substrate each comprising CMOS transistors and an inter-layer dielectric, and in said first semiconductor device substrate and said second semiconductor device substrate said inter-layer dielectric is atop said CMOS transistors and said inter-layer dielectric comprises SiO2 (Silicon dioxide);
   depositing a metal catalyst layer atop said inter-layer dielectric, wherein said metal catalyst layer comprises Ni (Nickel), or Co (Cobalt), or Ru (Ruthenium), or Mo (Molybdenum);
   depositing a diffusion material atop said metal catalyst layer, wherein said diffusion material comprises carbon;
   loading said first semiconductor device substrate and said second semiconductor device substrate into a process chamber comprising a top platen and a heatable bottom platen, wherein:
      said bottom platen is heated to a specified temperature,
      said top platen is configured to move up and down to apply a mechanical pressure to said first semiconductor device substrate and said second semiconductor device substrate and towards said heatable bottom platen, and
      loading said first semiconductor device substrate and said second semiconductor device substrate into the process chamber comprises:
         placing said first semiconductor device substrate face up onto said heatable bottom platen, and placing said second semiconductor device substrate face down atop said first semiconductor device substrate;
   applying said mechanical pressure, wherein said mechanical pressure is greater than 30 psi and less than 1000 psi; and
   forming graphene, wherein said graphene is disposed at an interface of said inter-layer dielectric and said metal catalyst layer of each of said first semiconductor device substrate and said second semiconductor device substrate;

wherein said process chamber is a part of a modified or unchanged commercial bonding tool, hot-press tool, or pressure and temperature-controlled reactor
wherein a gaseous pressure in said process chamber is greater than 2 atm, and wherein said gaseous pressure impinges on said second semiconductor device substrate.

2. The method of claim 1,
wherein said diffusion material comprises amorphous carbon.

3. The method of claim 1,
wherein said graphene comprises a high-quality graphene material.

4. The method of claim 1, wherein said first semiconductor device substrate and said second semiconductor device substrate each comprise a single-crystal, polycrystalline, or amorphous semiconductor elements.

5. The method of claim 1,
wherein said top platen is heatable.

6. The method of claim 1,
wherein during said applying said mechanical pressure and said forming graphene, said process chamber is evacuated to a pressure of less than 10-3 torr then supplied with an inert gas, and
wherein said inert gas comprises Nitrogen, Helium, and/or Argon.

7. The method of claim 1,
wherein said specified temperature is greater than 50° C. and less than 450° C.

8. A method of forming transistor interconnects, the method comprising:
providing a first semiconductor device substrate and a second semiconductor device substrate, said first semiconductor device substrate and said second semiconductor device substrate each comprising CMOS transistors and an inter-layer dielectric, and in said first semiconductor device substrate and said second semiconductor device substrate said inter-layer dielectric is atop said CMOS transistors and said inter-layer dielectric comprises SiO2 (Silicon dioxide);
depositing a metal catalyst layer atop said inter-layer dielectric, wherein said metal catalyst layer comprises Ni (Nickel), or Co (Cobalt), or Ru (Ruthenium), or Mo (Molybdenum);
depositing a diffusion material atop said metal catalyst layer, wherein said diffusion material comprises carbon;
loading said first semiconductor device substrate and said second semiconductor device substrate into a process chamber comprising a top platen and a heatable bottom platen, wherein:
said bottom platen is heated to a specified temperature,
said top platen is configured to move up and down to apply a mechanical pressure to said first semiconductor device substrate and said second semiconductor device substrate and towards said heatable bottom platen, and
loading said first semiconductor device substrate and said second semiconductor device substrate into the process chamber comprises:
placing said first semiconductor device substrate face up onto said heatable bottom platen, and
placing said second semiconductor device substrate face up atop said first semiconductor device substrate;
applying said mechanical pressure, wherein said mechanical pressure is greater than 30 psi and less than 1000 psi; and
forming graphene, wherein said graphene is disposed at an interface of said inter-layer dielectric and said metal catalyst layer of each of said first semiconductor device substrate and said second semiconductor device substrate;
wherein said process chamber is a part of a modified or unchanged commercial bonding tool, hot-press tool, or pressure and temperature-controlled reactor;
wherein a gaseous pressure in said process chamber is greater than 2 atm, and wherein said gaseous pressure impinges on said second semiconductor device substrate.

9. The method of claim 8,
wherein the diffusion material comprises amorphous carbon.

10. The method of claim 8,
wherein said graphene comprises a high-quality graphene material.

11. The method of claim 8,
wherein said first semiconductor device substrate and said second semiconductor device substrate each comprise a single-crystal, polycrystalline, or amorphous semiconductor elements.

12. The method of claim 8,
wherein said top platen is heatable.

13. The method of claim 8,
wherein during said applying said mechanical pressure and said forming graphene, said process chamber is evacuated to a pressure of less than 10-3 torr then supplied with an inert gas, and
wherein said inert gas comprises Nitrogen, Helium, and/or Argon.

14. The method of claim 8,
wherein said specified temperature is greater than 50° C. and less than 450° C.

15. A method of forming transistor interconnects, the method comprising:
providing a first semiconductor device substrate and a second semiconductor device substrate, said first semiconductor device substrate and said second semiconductor device substrate each comprising CMOS transistors and an inter-layer dielectric, and in said first semiconductor device substrate and said second semiconductor device substrate said inter-layer dielectric is atop said CMOS transistors and said inter-layer dielectric comprises SiO2 (Silicon dioxide);
depositing a metal catalyst layer atop said inter-layer dielectric, wherein said metal catalyst layer comprises Ni (Nickel), or Co (Cobalt), or Ru (Ruthenium), or Mo (Molybdenum);
depositing a diffusion material atop said metal catalyst layer, wherein said diffusion material comprises carbon;
loading said first semiconductor device substrate and said second semiconductor device substrate into a process chamber comprising a top platen and a heatable bottom platen, wherein:
said bottom platen is heated to a specified temperature,
said top platen is configured to move up and down to apply a mechanical pressure to said first semiconductor device substrate and said second semiconductor device substrate and towards said heatable bottom platen, and loading said first semiconductor device substrate and said second semiconductor device substrate into the process chamber comprises:
placing said first semiconductor device substrate face down onto said heatable bottom platen, and
placing said second semiconductor device substrate face down atop said first semiconductor device substrate;
applying said mechanical pressure, wherein said mechanical pressure is greater than 30 psi and less than 1000 psi; and
forming graphene, wherein said graphene is disposed at an interface of said inter-layer dielectric and said metal catalyst layer of each of said first semiconductor device substrate and said second semiconductor device substrate;
wherein said process chamber is a part of a modified or unchanged commercial bonding tool, hot-press tool, or pressure and temperature-controlled reactor;
wherein a gaseous pressure in said process chamber is greater than 2 atm, and wherein said gaseous pressure impinges on said second semiconductor device substrate.

16. The method of claim 15,
wherein said specified temperature is greater than 50° C. and less than 450° C.

17. The method of claim 15,
wherein said graphene comprises a high-quality graphene material.

* * * * *